(12) United States Patent
Shimizu et al.

(10) Patent No.: US 11,264,259 B2
(45) Date of Patent: Mar. 1, 2022

(54) WORKPIECE CONVEYANCE APPARATUS, SEMICONDUCTOR MANUFACTURING APPARATUS, AND WORKPIECE CONVEYANCE METHOD

(71) Applicant: THE JAPAN STEEL WORKS, LTD., Tokyo (JP)

(72) Inventors: Ryo Shimizu, Kanagawa (JP); Miki Sawai, Kanagawa (JP); Hirotaka Sazuka, Kanagawa (JP); Daisuke Ito, Kanagawa (JP)

(73) Assignee: THE JAPAN STEEL WORKS, LTD., Tokyo (JP)

( * ) Notice: Subject to any disclaimer, the term of this patent is extended or adjusted under 35 U.S.C. 154(b) by 212 days.

(21) Appl. No.: 15/769,728

(22) PCT Filed: Oct. 25, 2016

(86) PCT No.: PCT/JP2016/081617
§ 371 (c)(1),
(2) Date: Apr. 19, 2018

(87) PCT Pub. No.: WO2017/073573
PCT Pub. Date: May 4, 2017

(65) Prior Publication Data
US 2018/0315633 A1    Nov. 1, 2018

(30) Foreign Application Priority Data

Oct. 27, 2015 (JP) .............................. JP2015-211276

(51) Int. Cl.
*H01L 21/677* (2006.01)
*C03B 25/093* (2006.01)
(Continued)

(52) U.S. Cl.
CPC .... *H01L 21/67784* (2013.01); *B23K 26/0838* (2013.01); *B23K 26/354* (2015.10);
(Continued)

(58) Field of Classification Search
CPC .................................................. H01L 21/67784
See application file for complete search history.

(56) References Cited

U.S. PATENT DOCUMENTS

2016/0046045 A1\* 2/2016 Matsumoto ........... G03F 9/7042
264/496

FOREIGN PATENT DOCUMENTS

| CN | 104412366 A | 3/2015 |
| CN | 105830201 A | 8/2016 |

(Continued)

OTHER PUBLICATIONS

English translation of the Written Opinion dated May 11, 2018 issued in International Application No. PCT/JP2016/081617.
(Continued)

*Primary Examiner* — Mohammad M Choudhry
(74) *Attorney, Agent, or Firm* — Holtz, Holtz & Volek PC (57) ABSTRACT

A workpiece conveyance apparatus having: a conveyance path on which the workpiece moves; a gas flotation section that gas-floats the workpiece over the conveyance path; a movable holding section that holds the workpiece to move on the conveyance path along with the workpiece; and a treatment region conveyance path that is located on the conveyance path, and has a treatment region where predetermined treatment for the workpiece is performed, wherein the movable holding section has at least two or more holding sections along a movement direction of the conveyance path, each of the holding sections is capable of switching between release of holding and holding for the workpiece during movement of the workpiece, operation for releasing
(Continued)

holding of the workpiece by the holding section on the treatment region conveyance path, and holding the workpiece on the conveyance path other than the treatment region conveyance path.

15 Claims, 6 Drawing Sheets (51) Int. Cl.
  *C03B 35/24*   (2006.01)
  *B23K 26/354*   (2014.01)
  *B23K 26/08*   (2014.01)
  *B65G 51/03*   (2006.01)
  *C03B 25/02*   (2006.01)
  *C03B 35/00*   (2006.01)
  *H01L 21/67*   (2006.01)
  *H01L 21/683*   (2006.01)
  *C03B 32/02*   (2006.01)
  *H01L 21/02*   (2006.01)

(52) U.S. Cl.
  CPC .............. *B65G 51/03* (2013.01); *C03B 25/02* (2013.01); *C03B 25/093* (2013.01); *C03B 35/005* (2013.01); *C03B 35/24* (2013.01); *H01L 21/6776* (2013.01); *H01L 21/67115* (2013.01); *H01L 21/67259* (2013.01); *H01L 21/6838* (2013.01); *B65G 2249/04* (2013.01); *C03B 32/02* (2013.01); *H01L 21/02532* (2013.01); *H01L 21/02592* (2013.01); *H01L 21/02675* (2013.01); *H01L 21/6831* (2013.01)

(56) References Cited

FOREIGN PATENT DOCUMENTS

| | | | |
|---|---|---|---|
| JP | 2002280321 | A | 9/2002 |
| JP | 2008153261 | A | 7/2008 |
| JP | 2009010161 | A | 1/2009 |
| JP | 2014192267 | A | 10/2014 |
| KR | 20140143852 | A | 12/2014 |
| TW | 201546904 | A | 12/2015 |
| WO | 2014156380 | A1 | 10/2014 |
| WO | 2015174347 | A1 | 11/2015 |

OTHER PUBLICATIONS

International Search Report (ISR) dated Jan. 24, 2017 issued in International Application No. PCT/JP2016/081617.
Written Opinion dated Jan. 24, 2017 issued in International Application No. PCT/JP2016/081617.

* cited by examiner

WORKPIECE CONVEYANCE APPARATUS, SEMICONDUCTOR MANUFACTURING APPARATUS, AND WORKPIECE CONVEYANCE METHOD

TECHNICAL FIELD

The present invention relates to a workpiece conveyance apparatus, a semiconductor manufacturing apparatus, and a workpiece conveyance method for floating a workpiece with gas to move the workpiece over a conveyance path.

BACKGROUND ART

In annealing treatment of a workpiece, annealing treatment is performed for purposes of, for example, irradiating an amorphous semiconductor provided on a silicon substrate, a glass substrate, or the like with laser light to crystallize the amorphous semiconductor, irradiating a non-single-crystal semiconductor with laser light to single-crystallize the non-single-crystal semiconductor, irradiating a semiconductor with laser light to modify the semiconductor, activating or stabilizing impurities, or the like.

The purposes of the annealing treatment are not limited to the above, and all treatment for irradiating a workpiece with laser light to perform heat treatment is included.

In the annealing treatment, while a semiconductor is being moved, the semiconductor is irradiated with laser light, so that treatment by scanning with the laser light is performed. At this time, proper annealing treatment is performed by suitably defining a focus of the laser light with respect to the semiconductor. When a focal position with respect to the semiconductor is displaced, the annealing treatment is not properly performed, and the treatment is likely to become ununiform. Therefore, also when the semiconductor is moved, the posture of a workpiece needs to be held and flatness needs to be maintained.

Conventionally, a semiconductor is placed on a stage, and the semiconductor is moved by movement of this stage. However, it is difficult to move the stage in a stable posture, and the semiconductor is placed on the stage, and therefore influence of the structure and shape thereof under the substrate is received. For example, a stage upper surface is not completely flat, and has a pin, a groove shape, and the like for delivering the substrate, so that treatment unevenness by laser light irradiation occurs. Therefore, there is proposed an apparatus that gas-floats the substrate and moves the substrate with a part of the substrate being grasped, to improve production efficiency (for example, see Patent Literature 1).

CITATION LIST

Patent Literature

[Patent Literature 1] Japanese Patent Laid-Open No. 2002-280321

SUMMARY OF INVENTION

Technical Problem

However, also in the apparatus that floats gas, when the substrate is irradiated with laser light in a state where a back surface of the substrate is grasped near an irradiation area by a grasping section, there is a possibility that irradiation unevenness by ununiform reflection of the laser light due to the surface shape of the grasping section, or ununiform heat conduction by the substrate and the grasping section surface shape is generated. Particularly, recently, the need for large substrate treatment is growing, the number of the grasping sections needs to be increased, and the irradiation unevenness is more likely to occur.

The present invention has been made in view of the above circumstances, and an object of the present invention is to provide a workpiece conveyance apparatus, a semiconductor manufacturing apparatus, and a workpiece conveyance method enabling improvement of treatment unevenness and the like due to the structure and the shape of a workpiece lower side, and holding of a workpiece.

Solution to Problem

In the above, the laser annealing apparatus is employed as an example of the problem, the present invention solves this in the description. However, the present invention is not limited to application to the laser annealing apparatus, and is widely applicable to an apparatus which requires uniformity with no treatment unevenness, in apparatuses that convey a workpiece to perform treatment during conveyance.

That is, a first aspect of a workpiece conveyance apparatus of the present invention is a workpiece conveyance apparatus for conveying a workpiece having: a conveyance path on which the workpiece moves; a gas flotation section that gas-floats the workpiece over the conveyance path; a movable holding section that holds the workpiece floated by the gas flotation section to move on the conveyance path along with the workpiece; and a treatment region conveyance path that is located on the conveyance path, and has a treatment region where predetermined treatment for the workpiece is performed, wherein the movable holding section has at least two or more holding sections along a movement direction of the conveyance path, and each of the holding sections is capable of switching between release of holding and holding for the workpiece during movement of the workpiece.

In the present invention of the above aspect, a workpiece conveyance apparatus of another aspect having a controller that controls operation of the movable holding section, wherein the controller acquires positional information on the conveyance path of the movable holding section, causes the holding sections to perform operation for releasing holding of the workpiece in the treatment region conveyance path on the basis of the positional information, and controls operation for performing the holding in the conveyance path other than the treatment region conveyance path.

According to a workpiece conveyance apparatus of another aspect, in the present invention of the above aspect, the two or more holding sections along the movement direction of the conveyance path are located on the same axis along the movement direction.

In the present invention of the above aspect, a workpiece conveyance apparatus of another aspect has a second gas flotation section in the treatment region conveyance path, the second gas flotation section being different from the gas flotation section in the conveyance path other than the treatment region conveyance path.

According to a workpiece conveyance apparatus of another aspect, in the present invention of the above aspect, the holding sections are in a non-contact state with the workpiece when the holding is released.

According to a workpiece conveyance apparatus of another aspect, in the present invention of the above aspect, the holding sections have respective lower holding sections that hold the workpiece on a lower surface side, and have respective elevating and lowering mechanisms that elevate and lower the lower holding sections, and perform operation such that the lower holding sections elevate in the holding, and the lower holding sections lower in release of the holding.

According to a workpiece conveyance apparatus of another aspect, in the present invention of the above aspect, the holding sections have respective upper holding sections that hold the workpiece on an upper surface side, and have respective elevating and lowering mechanisms that elevate and lower the upper holding sections, and perform operation such that the upper holding sections lower in the holding, and the upper holding sections elevate in release of the holding.

According to a workpiece conveyance apparatus of another aspect, in the present invention of the above aspect, each of the holding sections has an electrostatic holding section or a suction holding section.

According to a workpiece conveyance apparatus of another aspect, in the present invention of the above aspect, each of the holding sections is capable of changing holding force.

According to a workpiece conveyance apparatus of another aspect, in the present invention of the above aspect, each of the holding sections changes size of a holding surface having holding force to change the holding force.

According to a workpiece conveyance apparatus of another aspect, in the present invention of the above aspect, each of the holding sections reduces the holding force before reaching the treatment region conveyance path, reduces the holding force to restart holding after passing the treatment region conveyance path, and thereafter returns the reduced holding force to the usual holding force.

According to a workpiece conveyance apparatus of another aspect, in the present invention of the above aspect, the predetermined treatment is laser annealing.

A workpiece conveyance apparatus of another aspect is a workpiece conveyance apparatus for conveying a workpiece including: a conveyance path on which the workpiece moves; a gas flotation section that gas-floats the workpiece over the conveyance path; a movable holding section that holds the workpiece floated by the flotation section to move on the conveyance path along with the workpiece; and a treatment region conveyance path that is located on the conveyance path, and has a region where predetermined treatment for the workpiece is performed; a position detection section that acquires a position of the workpiece on the treatment region conveyance path; a height position adjustment section that adjusts a height position of the workpiece; and a position controller that controls the height position adjustment section, wherein the position controller receives a detection result of the position detection section, and causes the height position adjustment section to adjust the position of the workpiece on the treatment region conveyance path on the basis of the detection result.

According to a workpiece conveyance apparatus of another aspect, in the present invention of the above aspect, the movable holding section has at least two or more holding sections along a movement direction of the conveyance path, and is capable of adjusting holding positions by the holding sections, and is capable of adjusting the position of the workpiece as the position adjustment section.

According to a workpiece conveyance apparatus of another aspect, in the present invention of the above aspect, each of the holding sections is capable of switching between release of holding and holding for the workpiece during movement of the workpiece.

A first aspect of a semiconductor manufacturing apparatus of the present invention including: the workpiece conveyance apparatus described in the present invention of the above aspect, wherein a workpiece to be conveyed by the workpiece conveyance apparatus is a semiconductor.

A first aspect of a workpiece conveyance method of the present invention is a workpiece conveyance method for conveying a workpiece having: a gas flotation step of gas-floating the workpiece; and a conveyance step of holding the floating workpiece by a holding section to move the holding section on a conveyance path along with the workpiece, wherein in the conveyance step, the workpiece is held by a plurality of holding sections along a movement direction, holding by the holding section located in a treatment region conveyance path is released in a state where the holding section reaches the treatment region conveyance path where predetermined treatment for the workpiece is performed, the treatment region conveyance path being included in the conveyance path, and the holding is performed when the holding section that releases the holding passes the treatment region conveyance path.

According to a workpiece conveyance method of another aspect, in the present invention of the above aspect, when the holding by the holding section is released, the holding section is brought into a non-contact state with the workpiece.

Advantageous Effect of Invention

That is, according to the present invention, predetermined treatment can be uniformly performed for a workpiece while avoiding treatment unevenness due to a structure and a shape of a workpiece lower side, and workpiece holding.

DESCRIPTION OF EMBODIMENTS

Hereinafter, a laser annealing apparatus of an embodiment of the present invention will be described with reference to the attached drawings.

The laser annealing apparatus of this embodiment is equivalent to the semiconductor manufacturing apparatus.

Figure 1:
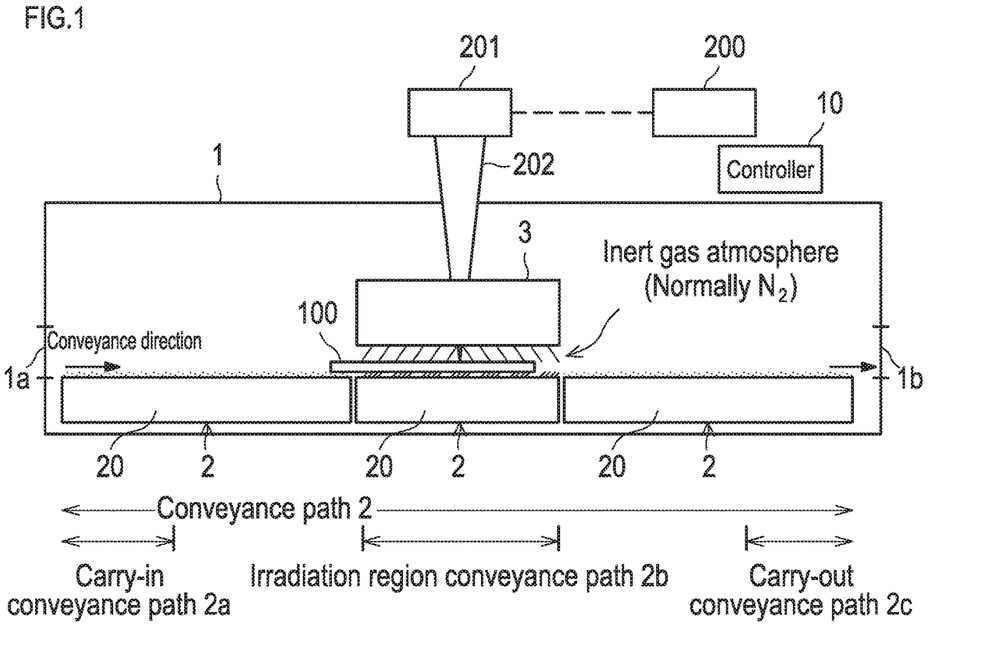
FIG. 1 is a front sectional view illustrating the outline of a laser annealing apparatus in which a movable holding section is omitted, according to an embodiment of the present invention.

FIG. 1 illustrates an outline of the laser annealing apparatus. In this embodiment, as a workpiece 100, an object obtained by forming a semiconductor film on a glass substrate is an object to be treated. The movable holding section is omitted in the drawing.

The laser annealing apparatus has a treatment chamber 1 for performing convey and treatment of the workpiece 100. As illustrated in FIG. 1, the treatment chamber 1 has a rectangular parallelepiped wall section, and a carry-in port 1*a* (left in the drawing) and a carry-out port 1*b* (right in the drawing) are provided in respective longitudinal facing walls. The carry-in port 1*a* and the carry-out port 1*b* may be open. Additionally, although not illustrated, the carry-in port 1*a* and the carry-out port 1*b* may be provided on the same side, or each can have an openable configuration. As the openable configuration, a simple sealing structure can be employed.

In the treatment chamber 1, a conveyance path 2 is provided from the inside of the carry-in port 1*a* to the inside of the carry-out port 1*b*, and gas flotation apparatus 20 is disposed on the conveyance path 2. The gas flotation apparatus 20 ejects gas from the lower side to the upper side, floats and supports the workpiece 100 located on the upper side, and is equivalent to the gas flotation section of the present invention.

The gas flotation apparatus 20 has a plurality of ejecting positions (not illustrated), so that it is possible to adjust the posture, the deflection, and the like of the workpiece 100.

Figure 2:
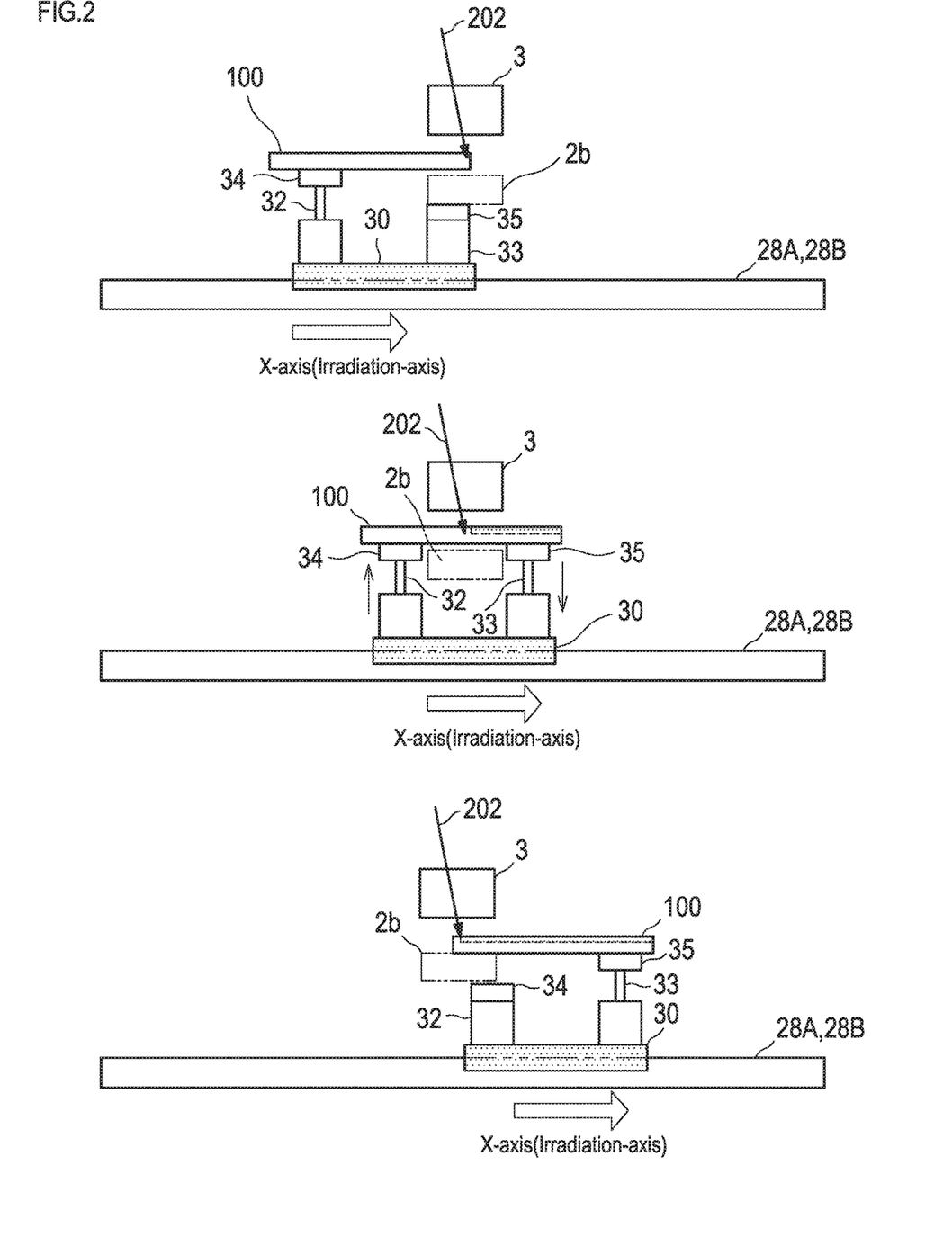
FIG. 2 is a front view illustrating the outline of the workpiece conveyance apparatus similarly.
Figure 3:
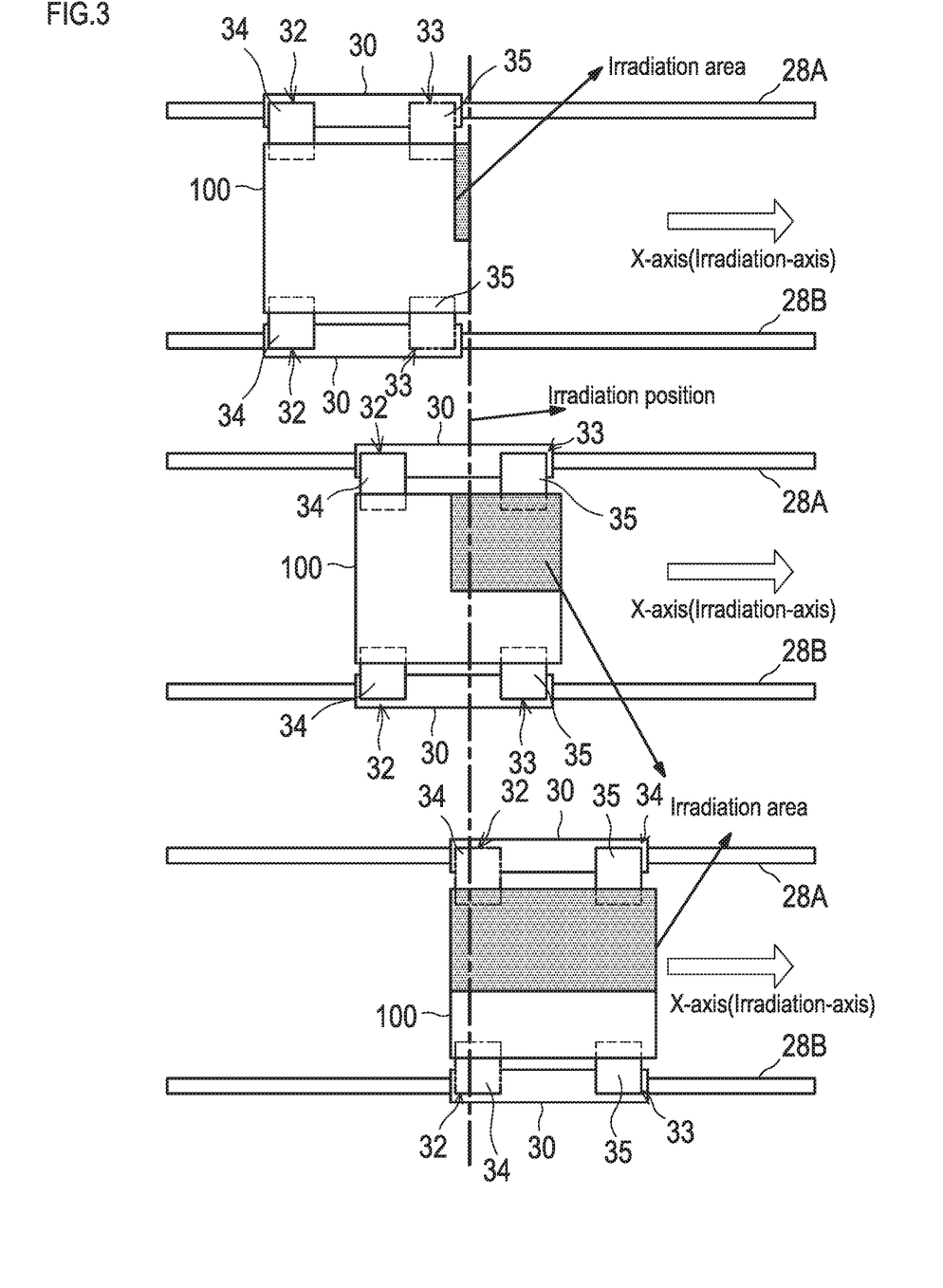
FIG. 3 is a plan view illustrating the outline of the workpiece conveyance apparatus similarly.

As illustrated in FIG. 3, guides 28A, 28B are disposed on the both sides of the conveyance path 2 along the longitudinal direction. In the guides 28A, 28B, respective movable slide sections 30 are provided along the guides 28A, 28B, as illustrated in FIGS. 2 and 3. Elevating and lowering sections 32, 33 that are capable of elevating and lowering, and vertically adjusting positions are provided on the respective slide sections 30. In this figure, the single slide section 30 for each of the guides 28A, 28B is illustrated. However, the number of the slide sections can be an appropriate number. Additionally, as the number of elevating and lowering sections provided in each slide section, an appropriate number can be selected.

As illustrated in FIG. 3, support sections 34, 35 are provided on the elevating and lowering sections 32, 33, the elevating and lowering sections 32, 33 elevate, so that the lower surface side of the workpiece 100 that is floated by the gas flotation apparatus 20 can be supported by the support sections 34, 35. Additionally, the elevating and lowering sections 32, 33 lower, so that the support by the support sections 34, 35 supporting the workpiece 100 can be released, and switching between support and release can be performed.

In this embodiment, the slide section 30, the elevating and lowering sections 32, 33, and the support sections 34, 35 are equivalent to the movable holding section of the present invention, and the elevating and lowering sections 32, 33, and the support sections 34, 35 are each equivalent to the holding section of the present invention.

Furthermore, a laser light source 200 that outputs laser light is provided outside the treatment chamber 1, as illustrated in FIG. 1. As the present invention, the kind of laser light is not particularly limited, and may be either a continuous wave or a pulse wave. In an optical path of the laser light, an optical system member 201 composed of a mirror, a lens, and the like is disposed. In this example, line beam shaped laser light 202 is introduced in the treatment chamber 1, and the workpiece 100 on the conveyance path 2 is irradiated with the laser light 202.

Furthermore, in the treatment chamber 1, a local gas seal section 3 that covers a laser light irradiation region and its surroundings, and jets local gas downward is fixed to be installed above the region irradiated with the laser light 202. Assuming that the injection region of the local gas includes at least a region irradiated with laser light, an appropriate range can be determined.

The laser light source 200, and the optical system member 201 compose a laser light irradiation section of the present invention. In this embodiment, the workpiece 100 is irradiated by the laser light 202, so that laser annealing treatment is performed, and in this embodiment, the laser annealing treatment is equivalent to predetermined treatment of the present invention.

In the conveyance path 2, at the time of conveyance, the region where the workpiece 100 is irradiated with the laser light 202 is the irradiation region. As illustrated in FIG. 1, in the periphery of the front and the back in the movement direction interposed with the irradiation region therebetween, a part of the conveyance path 2 composes an irradiation region conveyance path 2*b*. The irradiation region conveyance path 2*b* is equivalent to the treatment region conveyance path of the present invention, and can be made to have a length range equal to a length range of the local gas seal section 3, for example. When the laser light 202 does not move, the irradiation region conveyance path 2*b* is a fixed region. However, when the laser light 202 moves, the irradiation region conveyance path 2*b* moves with the movement of the laser light.

Which range the irradiation region conveyance path 2*b* is set is determined by selecting at least all ranges where laser irradiation is influenced by holding of the workpiece 100. Additionally, a position where holding by the holding section is switched is changed to a portion other than the irradiation region conveyance path 2*b*, the portion being separated from the irradiation region, so that a height position by holding is enabled not to influence an irradiation position, the Z-axis always does not need to be operated during irradiation treatment, and a stable and uniform irradiation result is obtained.

However, when the irradiation region conveyance path 2*b* is too long, such too long irradiation region conveyance path influences the holding of the workpiece 100, and therefore a suitable range is preferably set. As the present invention, the suitable range is not limited to a specific range. For example, the range can include a length of 300 mm to 1000 mm from each of the front and the back in the movement direction with respect to the irradiation region.

In the irradiation region conveyance path 2*b*, the workpiece 100 needs to move at a conveyance speed in process treatment, and the slide sections 30 move at a conveyance speed in accordance with a scanning speed in the process treatment. In the case of a configuration in which the irradiation position of the laser light 202 can be changed, the conveyance speed by each movable holding section is determined such that the laser light 202 moves at the scanning speed relatively, including the irradiation position of the laser light 202. The scanning speed is desirably fixed in terms of control of the speed, and uniformity of the treatment.

In order to maintain flatness of the workpiece 100, gas flotation is more precisely performed in the irradiation region conveyance path 2*b* compared to the conveyance path other than the irradiation region conveyance path 2*b*, and the irradiation region conveyance path 2*b* may be distinguished from other conveyance path. The precise gas flotation can be performed by, for example, increasing the density of gas blow-off ports, or precisely controlling a floating amount by gas supply and discharge balance.

The conveyance path 2 including the above irradiation region conveyance path 2b, the gas flotation apparatus 20, the guides 28A, 28B, the slide sections 30, the elevating and lowering sections 32, 33, and the support sections 34, 35 configure the workpiece conveyance apparatus of the present invention.

Furthermore, the laser annealing apparatus has a controller 10 that performs operation of each movable holding section, output control of laser light, and the like, and conveyance of the slide sections 30, elevating and lowering operation of the elevating and lowering sections 32, 33, and the like are controlled. The controller 10 can be configured by a CPU, a program executed by the CPU, a storage section that stores a program, an operation parameter, and the like.

Now, laser annealing treatment using the above laser annealing apparatus will be described. The following operation is performed by control of the controller 10.

In the treatment chamber 1, gas injection or preparation of the gas injection is performed in the conveyance path 2 by the gas flotation apparatus 20, and the slide sections 30 move on the carry-in port 1a side along the guide 28A and the guide 28B.

On the other hand, the laser light source 200 outputs laser light, and a line beam is generated by the optical system member 201. In a standby state, the inside of the treatment chamber 1 is not irradiated with the beam of the laser light 202 by a part of members inside the optical system member 201, and it is possible to retreat at an appropriate portion outside the treatment chamber 1.

The workpiece 100 is supported by the support sections 34, 35 elevated up to holding positions by the elevating and lowering sections 32, 33, and is moved on the conveyance path 2 along the right of FIG. 2 along the guides 28A, 28B by the slide sections 30. The lower side of the workpiece 100 is supported by the support sections 34, 35, and the workpiece 100 itself can be moved and scanned in a state of securing a constant speed and high posture stability by the elevating and lowering sections 32, 33 and the slide sections 30. The supporting portions each are portions which do not influence the irradiation area and are located in front of and behind the laser anneal region.

In the movement along the guides 28A, 28B, the support sections 35 holding the workpiece 100 is lowered to predetermined positions by the elevating and lowering sections 33 in a state of reaching the irradiation region conveyance path 2b, and is in a non-contact state with the workpiece 100. In the non-contact state, the support sections 35 are desirably in non-contact at a distance which does not influence laser annealing. In a case where the workpiece is held in non-contact by electrostatic suction, the work piece is separated up to a distance which does not influence the laser annealing, so that the holding of the work piece can be released. The support sections 35 that have reached the irradiation region conveyance path 2b are kept in non-contact with the workpiece 100 directly before reaching the irradiation region conveyance path 2b. The workpiece 100 is hold by the support sections 34 (other support sections may be provided) which are not located in the irradiation region conveyance path 2b.

In the irradiation region conveyance path 2b, while the workpiece 100 is conveyed at a predetermined conveyance speed, a surface is irradiated with laser light 202 introduced in the treatment chamber 1, and a predetermined region of the workpiece 100 is subjected to annealing treatment. At this time, local gas is ejected from the local gas seal section 3 toward the workpiece 100. By treatment of irradiating the workpiece 100 with the laser light 202, for example, an amorphous semiconductor film is crystallized. At this time, both the support sections 34, 35 are not located in the irradiation region conveyance path 2b, and therefore it is possible to eliminate the influence of the workpiece holding by the laser light irradiation to avoid irradiation unevenness.

When the support sections 35 that have reached the irradiation region conveyance path 2b moves to pass the irradiation region conveyance path 2b, the support sections 35 are elevated by the elevating and lowering sections 33, and restart support of the workpiece 100, and treatment by the laser light irradiation is performed in a state where the workpiece 100 is supported by the support sections 34, 35.

In a state where the movement of the workpiece 100 proceeds, and the support sections 34 reach the irradiation region conveyance path 2b, the support sections 34 are lowered to predetermined positions by the elevating and lowering sections 32, and are in a non-contact state with the workpiece 100. Directly before the support sections 34 that have reached the irradiation region conveyance path 2b reach the irradiation region conveyance path 2b, the support sections 34 are brought into a non-contact state with the workpiece 100. The workpiece 100 is held by the support sections 35 (other support sections may be provided) which are not provided in the irradiation region conveyance path 2b.

When the support sections 34 that have reached the irradiation region conveyance path 2b move to pass the irradiation region conveyance path 2b, the support sections 34 are elevated by the elevating and lowering sections 32, holding of the workpiece 100 is restarted by suction, and the workpiece 100 is subjected to the treatment by the laser light irradiation in a state of being held by the support sections 34, 35.

In a case where other support sections are further provided, similar operation is performed in the support sections that reach the irradiation region conveyance path 2b, and support by the support sections are always unperformed in the irradiation region conveyance path 2b.

In switching of the holding of the support sections 34, 35, the switching of the holding is performed by the support sections located on the axes in the same direction, and therefore it is possible to reduce vibration at the time of switching of the holding of the substrate during irradiation.

When the workpiece 100 that has been subjected to the annealing treatment is conveyed up to the vicinity of the carry-out port 1b by the conveyance path 2, the support sections 34, 35 are lowered by the elevating and lowering sections 32, 33, and the support is released. The workpiece 100 is carried out from the carry-out port 1b of the treatment chamber 1 by the carry-out apparatus (not illustrated).

Thereafter, the slide sections 30 are returned and moved to an initial position on the carry-in port 1a side along the guides 28A, 28B by reciprocation, and are used for subsequent holding of the workpiece. The moving speed at the time of the return movement allows movement at a higher speed than the workpiece conveyance speed, and enables preparation for a next workpiece. Additionally, an annular guide may be installed to return up to the initial position.

In the above description, the holding of the workpiece is performed by the support. However, the holding method is not limited to this, and the holding of the workpiece may be performed by grasp, suction, an electrostatic chuck, or the like.

For example, in a case where the holding is performed by grasp, a pressing section is disposed on the upper side of the workpiece 100, and in the elevating and lowering sections 32, 33, movement in the direction opposite to the support sections 34, 35 is performed, so that it is possible to grasp and release the grasp.

Embodiment 2

Hereinafter, another mode according to the workpiece conveyance apparatus which performs holding of a workpiece by suction will be described with reference to FIG. 4.

Description of a configuration similar to the configuration of the above embodiment will be omitted or simplified.

Also in this embodiment, a gas flotation apparatus 20, guides 28A, 28B are disposed in a conveyance path 2, slide sections 30 are provided in the guides 28A, 28B, and elevating and lowering sections 32, 33 are provided in the respective slide sections 30.

Figure 4:
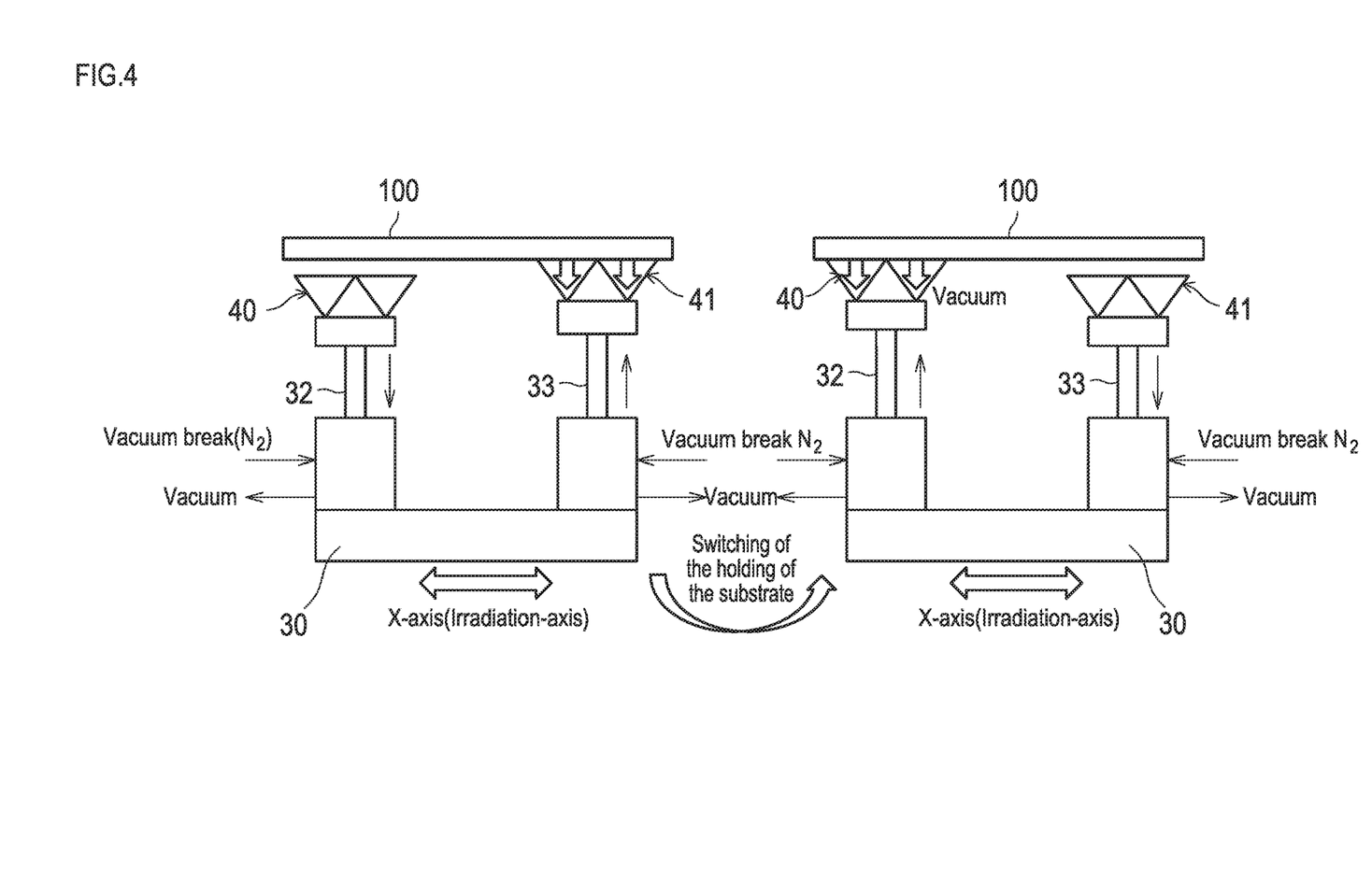
FIG. 4 is a front view illustrating the outline of a workpiece conveyance apparatus according to another embodiment of the present invention.

As illustrated in FIG. 4, in this embodiment, suction sections 40 are provided on the elevating and lowering sections 32, suction sections 41 are provided on the elevating and lowering sections 33, the elevating and lowering sections 32, 33 are elevated, and a workpiece 100 floated by the gas flotation apparatus 20 is sucked to be held by the suction sections 40, 41. The suction sections 40, 41 are connected to a suction apparatus (not illustrated), suction of the workpiece 100 is performed by upper surfaces of the suction sections 40, 41. Additionally, in the suction sections 40, 41, a gas supply section (not shown) can be selectively connected to the suction sections 40, 41 so as to supply gas to a suction surface in order to release the suction. Although the kind of gas that releases the suction is not particularly limited, inert gas (for example, nitrogen gas) which does not influence laser treatment is desirably used.

In this embodiment, the slide section 30, the elevating and lowering sections 32, 33, and the suction sections 40, 41 are equivalent to the movable holding section of the present invention, and the elevating and lowering sections 32, 33 and the suction sections 40, 41 are each equivalent to the holding section of the present invention.

In the conveyance path 2, the slide sections 30 move at a conveyance speed in accordance with a scanning speed in process treatment. Furthermore, the laser annealing apparatus has a controller 10 (illustrated in FIG. 1) that performs operation of each movable holding section, output control of laser light, and the like, and controls conveyance of the slide sections 30, elevating and lowering operation of the elevating and lowering sections 32, 33, elevating and lowering position adjustment, suction of the suction sections 40, 41, and suction and release operation. The controller 10 can be configured by a CPU, a program executed by the CPU, a storage section that stores a program, an operation parameter, and the like.

The conveyance path 2 including the above irradiation region conveyance path 2b, the gas flotation apparatus 20, the guides 28A, 28B, the slide sections 30, the elevating and lowering sections 32, 33, and the suction sections 40, 41 configure the workpiece conveyance apparatus of the present invention.

Now, laser annealing treatment using the above laser annealing apparatus will be described. The following operation is performed by control of the controller 10.

In a treatment chamber 1, in the conveyance path 2, gas flotation apparatus 20 jets gas, or prepares gas injection, and the slide sections 30 move on the carry-in port 1a side along the guides 28A, 28B.

The elevating and lowering sections 32, 33 is elevated up to holding positions, and the workpiece 100 is sucked by the suction sections 40, 41 to be moved to the left in FIG. 4 along the guides 28A, 28B by the slide sections 30.

As illustrated in the left figure of FIG. 4, in a state where the suction sections 40 holding the workpiece 100 reach the irradiation region conveyance path 2b, nitrogen gas for releasing suction is sent to the suction sections 40 to release the suction, and the suction sections 40 are lowered to predetermined positions by the elevating and lowering sections 32, and are in a non-contact state with the workpiece 100. The suction sections 40 that have reached the irradiation region conveyance path 2b are kept in non-contact with the workpiece 100 directly before reaching the irradiation region conveyance path 2b. The workpiece 100 is hold by the suction sections 41 which are not provided in the irradiation region conveyance path 2b.

In the irradiation region conveyance path 2b, while the workpiece 100 is conveyed at a conveyance speed, a surface is irradiated with laser light 202 introduced in the treatment chamber 1, and a predetermined region of the workpiece 100a is subjected to annealing treatment. For example, a semiconductor film is crystallized. At this time, both the suction sections 40, 41 are not located in the irradiation region conveyance path 2b, and therefore it is possible to eliminate the influence of the workpiece holding by the laser light irradiation to avoid irradiation unevenness.

When the suction sections 40 that have reached the irradiation region conveyance path 2b move to pass the irradiation region conveyance path 2b, the suction sections 40 are elevated by the elevating and lowering sections 32, and holding of the workpiece 100 is restarted by suction, and treatment by the laser light irradiation is performed in a state where the workpiece 100 is supported by the suction sections 40, 41.

In a state where the movement of the workpiece 100 proceeds, and the suction sections 41 reach the irradiation region conveyance path 2b, nitrogen gas for releasing suction is sent to the suction sections 41 to release the suction of the suction sections 41, the suction sections 41 are lowered to predetermined positions by the elevating and lowering sections 33, and are in a non-contact state with the workpiece 100 as illustrated in the right figure in FIG. 4. Directly before the suction sections 41 that have reached the irradiation region conveyance path 2b reach the irradiation region conveyance path 2b, the suction sections 41 are brought into a non-contact state with the workpiece 100. The workpiece 100 is held by the suction sections 40 which are not provided in the irradiation region conveyance path 2b.

When the suction sections 41 that have reached the irradiation region conveyance path 2b move to pass the irradiation region conveyance path 2b, the suction sections 41 are elevated by the elevating and lowering sections 33, holding of the workpiece 100 is restarted by suction, and the workpiece 100 is subjected to the treatment by the laser light irradiation in a state of being held by the suction sections 40, 41.

In a case where other support sections are further provided, similar operation is performed in the suction sections that reach the irradiation region conveyance path 2b, and holding by the suction sections are not always performed in the irradiation region conveyance path 2b.

In the above embodiment, in the suction sections, suction and release of the suction are continuously performed, and the switching of the holding of the substrate can be promptly performed during irradiation.

When the workpiece 100 that has been subjected to the annealing treatment is conveyed up to the vicinity of the carry-out port 1b by the conveyance path 2, the suction by the suction sections 40, 41 is released, the suction sections 40, 41 are lowered by the elevating and lowering sections 32, 33. The workpiece 100 is carried out from the treatment chamber 1 by the carry-out apparatus (not illustrated).

At this time, the slide sections 30 are returned and moved to an initial position on the carry-in port 1*a* side along the guides 28.

In this embodiment, the whole surface of the workpiece 100 is not vacuum-sucked, and therefore there are effects in foreign matter adhesion prevention, and antistatic to the back surface of the workpiece, when the workpiece is carried in.

In the holding of the workpiece by the above support sections or suction sections, release of the holding or restart of the holding by the holding sections located behind and in front of the irradiation region conveyance path 2*b* is performed. Therefore, there is a risk that the release of the holding or the restart of the holding causes small vibration in the workpiece, or displacement due to the switching of the holding is caused.

Embodiment 3

In the following embodiment, at the time of release of holding and restart of holding, holding force of holding sections is gradually or continuously changed, so that fluctuation in the release of holding and the restart of holding can be reduced. Components similar to the components of each of the above embodiments are denoted by the same reference numerals, and description thereof will be omitted or simplified.

Figure 5:
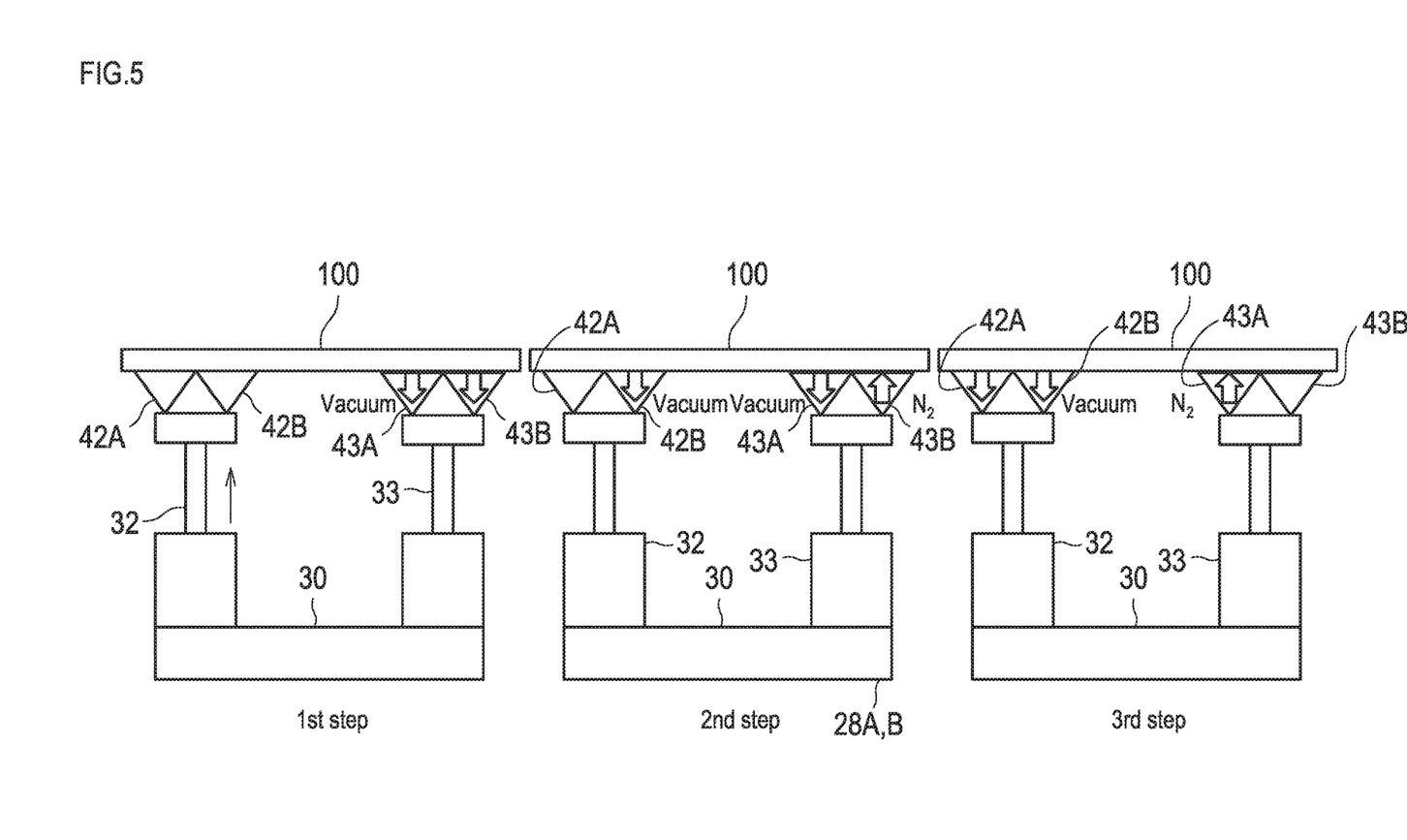
FIG. 5 is a front view illustrating the outline of a workpiece conveyance apparatus according to yet another embodiment of the present invention.

As illustrated in FIG. 5, in this embodiment, in each movable holding section, suction sections 42A, 42B are provided on an upper part of an elevating and lowering section 32, suction sections 43A, 43B are provided on an upper part of an elevating and lowering section 33, and suction sections 42A, 42B, 43A, 43B are each equivalent to the holding section of the present invention. Additionally, theses holding sections, a slide section 30, and elevating and lowering sections 32, 33 are equivalent to the movable holding section of the present invention. Operation of the movable holding sections is controlled by a controller 10.

The suction sections 42A, 42B, 43A, 43B can independently perform suction operation and suction release operation, and this operation is also controlled by the controller 10.

A conveyance path 2 including the above irradiation region conveyance path 2*b*, the gas flotation apparatus 20, the guides 28A, 28B, the slide sections 30, the elevating and lowering sections 32, 33, and the suction sections 42A, 42B, 43A, 43B configure the workpiece conveyance apparatus of the present invention.

Hereinafter, operation of the workpiece conveyance apparatus will be described.

In FIG. 5, a workpiece moves to the left in the figure. In the left figure, directly after the workpiece passes the irradiation region conveyance path 2*b*, the elevating and lowering sections 32 are elevated, and suction is prepared. The suction sections 43A, 43B are located outside the irradiation region conveyance path 2*b*, and therefore suction is performed by evacuation.

When the movement of the workpiece proceeds, as illustrated in the center located in the figure, suction is started by only the suction sections 42B among the suction sections 42A, 42B, and suction by the suction sections 42A is not performed. At this time, holding surfaces are reduced, and holding force is reduced compared to the usual, and therefore it is possible to reduce fluctuation by the suction. On the other hand, the suction sections 43A, 43B approach the irradiation region conveyance path 2*b,* and therefore among the suction sections 43A, 43B that perform suction, the suction sections 43A continue suction, and the suction sections 43B supply nitrogen gas to release the suction. Consequently, the fluctuation by the suction release is reduced.

Furthermore, when the workpiece 100 moves, as illustrated in the right in FIG. 5, in the suction sections 42A, 42B, suction sections 42A that do not perform suction restart suction, and holding by usual holding force by the suction sections 42A, 42B is performed.

On the other hand, in the suction sections 43A, 43B, nitrogen gas supply by the suction sections 43B is stopped, suction by the suction sections 43A is stopped, suction release by the nitrogen gas supply is performed. Consequently, it is possible to reduce fluctuation by suction release operation. After the suction release by the suction sections 43B is stopped, suction release may be performed by the suction sections 42A.

In the above mode, also in a case other than suction, fluctuation at the time of suction release, and suction restart can be reduced by changing holding force.

The suction sections each have a structure in which the lower side of the workpiece can be sucked, and nitrogen is used for suction release. At the timing of switching of the holding of the workpiece, suction is temporarily performed at the same time, and displacement or the like due to switching of the holding of the workpiece is prevented.

Embodiment 4

As illustrated in each of the above embodiments, when holding is switched depending on the positions of the holding sections, there is a possibility that there is influence on the posture of a workpiece. For example, in a case where a portion near an irradiation region is grasped, the height of a grasping section influences flatness of a glass substrate, and therefore the grasping section height needs to be adjusted in accordance with the flatness of the glass substrate during irradiation. Therefore, during process treatment, adjustment in the height direction is needed such that a workpiece surface is located within a focal depth.

On the other hand, it is considered that the position of the workpiece 100 located in the irradiation region conveyance path 2*b* or near the irradiation region conveyance path 2*b* is detected, and the posture of the workpiece 100 is controlled. Hereinafter, this embodiment will be described with reference to FIG. 6.

Figure 6:
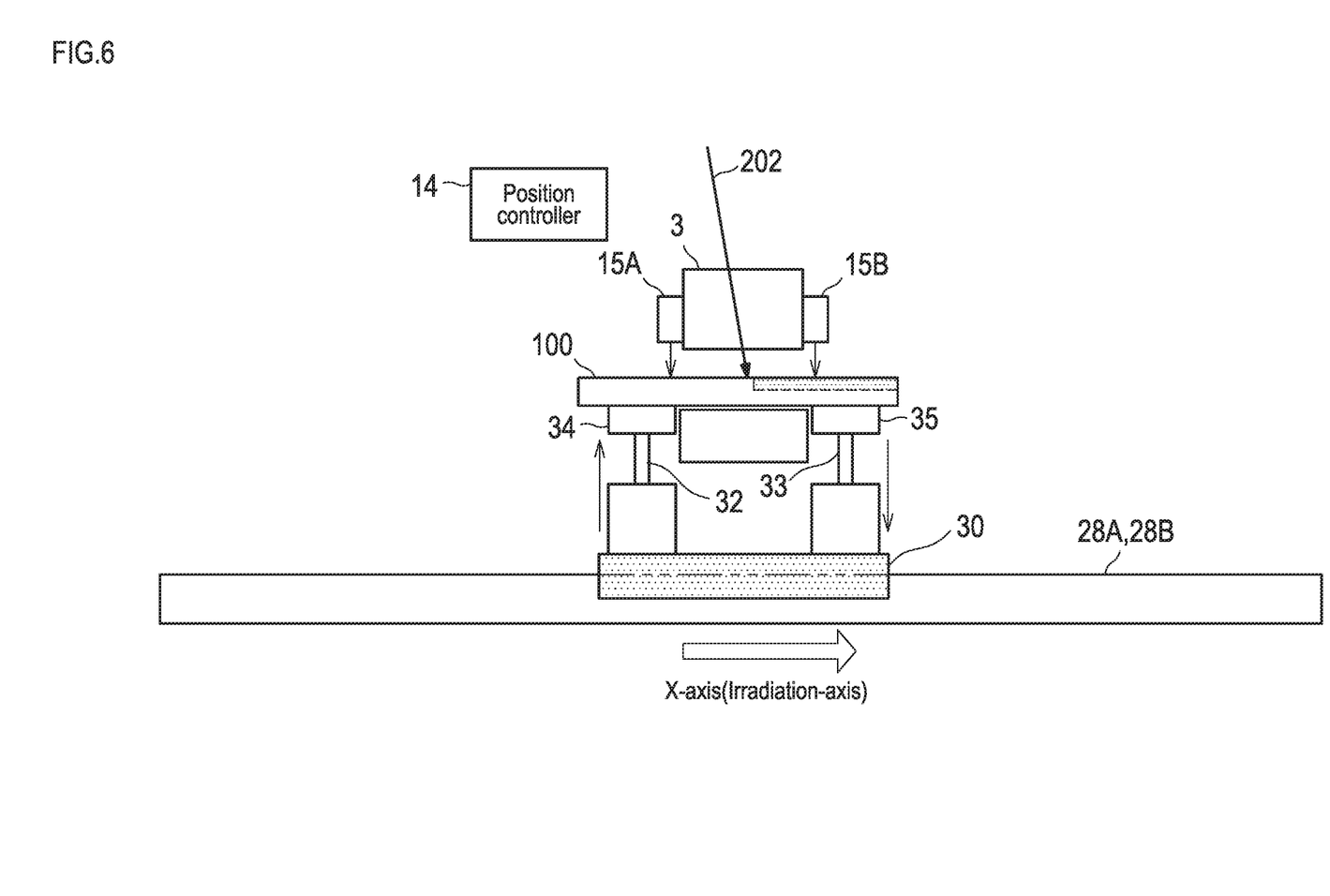
FIG. 6 is a front view illustrating the outline of a workpiece conveyance apparatus according to yet another embodiment of the present invention.

In this embodiment, laser displacement gauges 15A, 15B that measure a distance from a workpiece 100 are installed in a fixed residence gas seal section 3. The number of laser displacement gauges can be appropriately set, and, an inclination state of a workpiece with respect to the scanning direction can be known by measurement at different positions in the scanning direction, for example. Additionally, the inclination of the workpiece 100 in the width direction can be known by measurement at different positions in the direction intersecting with the scanning direction. The laser displacement gauges 15A, 15B are each equivalent to a position detection section. The laser displacement gauges 15A, 15B detect a height position of the workpiece located in the irradiation region conveyance path 2*b* or in the vicinity of the irradiation region conveyance path 2*b,* positional information of the workpiece located in the irradiation region conveyance path 2*b* is acquired. The position detection section that detects the distance or the height of the workpiece 100 is not limited to a specific one, and an appropriate sensor or the like can be used.

A position controller 14 is timely notified of measurement results of the laser displacement gauges 15A, 15B. The position controller 14 controls the holding height in each movable holding section, and can be configured by a CPU, a program executed by the CPU, a storage section that stores a program, an operation parameter, and the like.

The movable holding sections have slide sections 30, elevating and lowering sections 32, 33, and support sections 34, 35, similarly to the above embodiments. As the configurations of the movable holding sections, the holding sections of other embodiment described above may be employed.

Additionally, the controller 10 may serve as the position controller 14.

In this embodiment, a conveyance path 2 including an irradiation region conveyance path 2b, a gas flotation apparatus 20, guides 28A, 28B, the slide sections 30, the elevating and lowering sections 32, 33, and the support sections 34, 35 configure the workpiece conveyance apparatus of the present invention.

When the position controller 14 receives detection results of the laser displacement gauges 15A, 15B, the inclination of the workpiece 100 is calculated, and a position adjustment amount necessary for each of the support sections 34, 35 with respect to the inclination is calculated. At this time, the positions of the support sections 34, 35 in the width direction may be adjusted. The position controller 14 can appropriately adjust the respective holding heights of the support sections 34, 35 on the basis of the calculated results to accurately control the posture of the workpiece 100 in at least the irradiation region conveyance path 2b. Therefore, the elevating and lowering sections 32, 33, and the support sections 34, 35 are each equivalent to a position adjustment section.

In this embodiment, the posture of the workpiece in the irradiation region conveyance path 2b is controlled by the movable holding sections. However, position adjustment sections different from the movable holding sections are provided, and the posture of the workpiece may be controlled by the position adjustment sections. The configurations of the position adjustment sections are not particularly limited, and the posture of the workpiece in the irradiation region conveyance path may be controlled by holding sections different from the movable holding sections, adjustment of gas flotation, or the like. In this embodiment, release of the holding sections 34, 35 is performed in the irradiation region conveyance path. However, release operation of the support sections in the treatment region conveyance path may not be performed by the support sections 34, 35.

In each of the above embodiments, the workpiece conveyance apparatus applied to the laser annealing apparatus is described. However, the application range of the workpiece conveyance apparatus of the present invention is not limited to the laser annealing apparatus, the present invention can be applied to a workpiece conveyance apparatus such as a laser lift-off apparatus, and the application range of the present invention is not particularly limited.

The present invention is described on the basis of the above embodiments. However, the present invention is not limited to the description of the above embodiments, and these embodiments can be appropriately changed without departing from the scope of the present invention.

This application claims the priority based on Japanese patent application No. 2015-211276 filed on Oct. 27, 2015, all of which described in this application is incorporated for reference.

REFERENCE SIGNS LIST 2 conveyance path
2b irradiation region conveyance path
3 local gas seal section
10 controller
14 position controller
15A laser displacement gauge
15B laser displacement gauge
28A guide
28B guide
30 slide section
32 elevating and lowering section
33 elevating and lowering section
34 support section
35 support section
40 suction section
41 suction section
42A suction section
42B suction section
43A suction section
43B suction section
100 workpiece
200 laser light source
201 optical system member
202 laser light

The invention claimed is:

1. A workpiece conveyance apparatus for conveying a workpiece, the workpiece conveyance apparatus comprising:
a conveyance path;
a gas flotation section that gas-floats the workpiece over the conveyance path;
a movable holding section that holds the workpiece floated by the gas flotation section to move on the conveyance path along with the workpiece;
a treatment region conveyance path that is located on the conveyance path, and includes a treatment region where predetermined treatment for the workpiece is performed; and
a controller,
wherein:
the movable holding section comprises at least two holding sections along a movement direction of the conveyance path,
each of the holding sections is capable of switching between release of holding and holding the workpiece during movement of the workpiece,
each of the holding sections is capable of changing a holding force by which the holding section holds the workpiece, and
the controller individually controls the holding sections to hold the workpiece by a usual holding force, thereafter to reduce the holding force thereof from the usual holding force while continuing to hold the workpiece before reaching the treatment region conveyance path, then to release holding of the workpiece on passing the treatment region conveyance path, then to restart holding of the workpiece at a reduced holding force with respect to the usual holding force after passing the treatment region conveyance path, thereafter to increase the holding force from the reduced holding force to the usual holding force, and thereafter to hold the workpiece by the usual holding force.

2. The workpiece conveyance apparatus according to claim 1, wherein the controller acquires positional information on the conveyance path of the movable holding section, causes the holding sections to perform operation for releasing holding of the workpiece in the treatment region conveyance path based on the positional information, and controls operation for performing the holding in a region of the conveyance path outside of the treatment region conveyance path.

3. The workpiece conveyance apparatus according to claim 1, wherein the at least two holding sections along the movement direction of the conveyance path are located on a same axis along the movement direction.

4. The workpiece conveyance apparatus according to claim 1, further comprising another gas flotation section, wherein one of the gas flotation sections in the treatment region conveyance path is different from another one of the gas flotation sections in a region of the conveyance path outside of the treatment region conveyance path.

5. The workpiece conveyance apparatus according to claim 1, wherein the holding sections are in a non-contact state with the workpiece when the holding is released.

6. The workpiece conveyance apparatus according to claim 1, wherein each of the holding sections comprises a support section to hold a lower surface side of the workpiece, and an elevating and lowering mechanism operable to elevate the support section to hold the workpiece and to lower the support section to release the workpiece.

7. The workpiece conveyance apparatus according to claim 1, wherein each of the holding sections comprises an upper holding section to hold the workpiece on an upper surface side of the workpiece, and an elevating and lowering mechanism operable to elevate the upper holding section to release the workpiece and to lower the upper holding section to hold the workpiece.

8. The workpiece conveyance apparatus according to claim 1, wherein each of the holding sections has an electrostatic holding section or a suction holding section.

9. The workpiece conveyance apparatus according to claim 1, wherein each of the holding sections changes size of a holding surface thereof having holding force to change the holding force.

10. The workpiece conveyance apparatus according to claim 1, wherein the predetermined treatment is laser annealing.

11. The workpiece conveyance apparatus according to claim 1, further comprising:
a position detection section that acquires a position of the workpiece on the treatment region conveyance path;
a height position adjustment section that adjusts a height position of the workpiece; and
a position controller that controls the height position adjustment section,
wherein the position controller receives a detection result of the position detection section, and causes the height position adjustment section to adjust the position of the workpiece on the treatment region conveyance path based on the detection result.

12. A semiconductor manufacturing apparatus comprising the workpiece conveyance apparatus according to claim 1, wherein the workpiece is a semiconductor.

13. A workpiece conveyance method for conveying a workpiece on a conveyance path that includes a treatment region conveyance path where predetermined treatment for the workpiece is performed, the workpiece conveyance method comprising:
gas-floating the workpiece; and
holding the floating workpiece by a movable holding section that moves on the conveyance path along with the workpiece, the movable holding section comprising a plurality of holding sections arranged along a movement direction of the workpiece, each of the holding sections being capable of switching between release of holding and holding the workpiece during movement of the workpiece, and each of the holding sections being capable of changing a holding force by which the holding section holds the workpiece; and
individually controlling the holding sections to hold the workpiece by a usual holding force, thereafter to reduce the holding force thereof from the usual holding force while continuing to hold the workpiece before reaching the treatment region conveyance path, to then release holding of the workpiece on passing the treatment region conveyance path, then to restart holding of the workpiece at a reduced holding force with respect to the usual holding force after passing the treatment region conveyance path, thereafter to increase the holding force from the reduced holding force to the usual holding force, and thereafter to hold the workpiece by the usual holding force.

14. The workpiece conveyance method according to claim 13, wherein when the holding by any of the holding sections is released, the holding section is brought into a non-contact state with the workpiece.

15. The workpiece conveyance apparatus according to claim 1, wherein each of the holding sections comprises a plurality of individually controllable suction sections.

* * * * *